United States Patent [19]

Farè

[11] Patent Number: 4,458,191
[45] Date of Patent: Jul. 3, 1984

[54] STEP MOTOR DRIVE CIRCUIT
[75] Inventor: Carlo Farè, Limito, Italy
[73] Assignee: Honeywell Information Systems Italia, Caluso, Italy
[21] Appl. No.: 388,335
[22] Filed: Jun. 14, 1982

[30] Foreign Application Priority Data

Jun. 23, 1981 [IT] Italy ................ 22502 A/81

[51] Int. Cl.³ ........................................... H02K 29/02
[52] U.S. Cl. .................................. 318/696; 318/685
[58] Field of Search ................................ 318/685, 696

[56] References Cited

U.S. PATENT DOCUMENTS 3,486,096 12/1969 Van Cleave ............ 318/696
4,358,725 11/1982 Brendemuehl ............ 318/696

Primary Examiner—S. J. Witkowski
Assistant Examiner—Saul M. Bergmann
Attorney, Agent, or Firm—Faith F. Driscoll; Nicholas Prasinos

[57] ABSTRACT

A stepping motor drive circuit having pairs of magnetically coupled phase windings (1, 3 and 2, 4), comprises current chopping control circuits (23, 24) for controlling the on/off switching of a plurality of driving transistors (5, 6, 7, 8) each coupled to a respective phase winding, and the circuits associated with each switching transistor for reducing their storage times and hence switching losses. More particularly, with reference to the switching transistor (5), the related circuit for storage time reduction comprises a series connected capacitor (25) and a diode (45). The circuit connects between one terminal of one winding (2) of the pair of phase windings which is magnetically coupled to the one winding (1) of the other pair connected to such switching transistor (5) and to the base of such transistor (5). As soon as the transistor (5) is caused to switch from ON to OFF, the circuit applies a reverse voltage pulse to the base of the transistor (5) causing a fast transition towards the cutoff region. Besides improving the stepping motor efficiency for a high chopping frequency, the arrangement makes it possible to use switching transistors that dissipate power and are less expensive.

3 Claims, 4 Drawing Figures

STEP MOTOR DRIVE CIRCUIT

BACKGROUND OF THE INVENTION

1. Field of Use

The present invention relates to stepping motors and more particularly to drive circuits for stepping motors.

2. Prior Art

As known, a step motor comprises a rotor which consists of a permanent magnet having toothed pole pieces and a toothed stator having phase windings which, when energized, induce magnetic fields in the stator. In general, each phase winding is connected at one end to a D.C. voltage source and at the other end to a switching device (generally a power switch transistor. Such device when switched on allows an energizing current to flow through the phase winding. When the phase windings of a stepping motor are energized according to a suitable sequence, the magnetic fields induced in the stator interact with the rotor causing its rotation. In particular, the rotor is fed with an angle corresponding to a step for each current switching occurring in the phase windings.

At present, in order to improve the stepping motor performances, so-called current chopping control systems are used. Such "chopping" systems maintain the energization current in the phase windings to pre-established values during the entire time that the phase windings are energized. The "chopping" systems intermittently feed the phase windings. In other words, they switch off the feeding current when it reaches a prefixed value. This allows the established current to flow through a recirculating path and to decay with a time constant determined by the electrical characteristics of the recirculating path. The feeding current is again switched on after a predetermined time interval or when the circulating current is decayed to a second prefixed value, and so on for the entire energization time of the phases. Examples of such systems are given by U.S. Pat. Nos. 4,107,593 and 3,812,413.

A limit to the chopping frequency establishing when the energized windings are connected and disconnected from the voltage source, is determined by operational limitations of the power transistors used as switch devices. In fact, it has been found that such transistors which are controlled to work in the extreme conditions of cutoff and saturation, do not switch immediately from a working state to another but rather respond to the applied control signals after some delay time. In particular, the most critical situation occurs when a transistor switches from the saturation condition (ON) to the cutoff condition (OFF).

In such case, the saturation current nearly falls to zero after a relatively long delay time which for the most part is determined by so-called storage time. This is the time required to remove the minority carriers from the base of the transistor. Thus, during the time interval proportional to the storage time, the transistor operates in a condition of high collector-emitter voltage drop at the same time a high current is flowing therethrough. During the period of switching from ON to OFF, a considerable peak of power is required to be absorbed by a switching transistor. At high switching frequencies, for example, those above the acoustic frequencies, a current chopping control system, besides requiring the use of switching transistors with high power dissipation (therefore very expensive), also produces a degradation in stepping motor efficiency.

One solution to the problem is to remove the main cause of the switching losses, that is, remove or at least reduce the storage time of a power switch transistor during its ON to OFF switching.

A method known in the art for reducing the storage time of a transistor consists of applying a reverse voltage to the base of the switch transistor so as to speed up the removal of the minority carriers from its base. Besides presupposing the use of both positive and negative voltages in the stepping motor drive circuit with a consequent increase in the complexity of the power supply, the method also requires that high level control signals be applied to the transistors. This results in more expensive drive logic circuits.

SUMMARY OF THE INVENTION

The drive circuit of the present invention avoids the above disadvantages and allows the storage time of the switching transistors to be reduced to a minimum simply and inexpensively.

For a certain chopping frequency, the drive circuit of the invention, besides improving the stepping motor efficiency, also allows the use of less expensive switching transistors.

As to a four phase stepping motor, the above advantages are obtained by exploiting the high magnetic coupling of those pairs of stator windings which are geometrically and electrically in phase opposition. During the current chopping in an energized phase winding, and more particularly, the winding next to receive the switching command which leads from the ON condition to the OFF condition of the transistor associated with such energized phase winding, the electromotive force induced into the phase winding magnetically coupled to the energized winding under examination is used to apply a reverse voltage to the base of the switching transistor associated with the energized phase winding. The reverse voltage is applied in such a way that a fast transition of such transistor towards the cutoff region is obtained.

These and other features will appear more clearly from the following description of a preferred embodiment of the invention and from the following drawings.

DESCRIPTION OF THE PREFERRED EMBODIMENT

Figure 1:
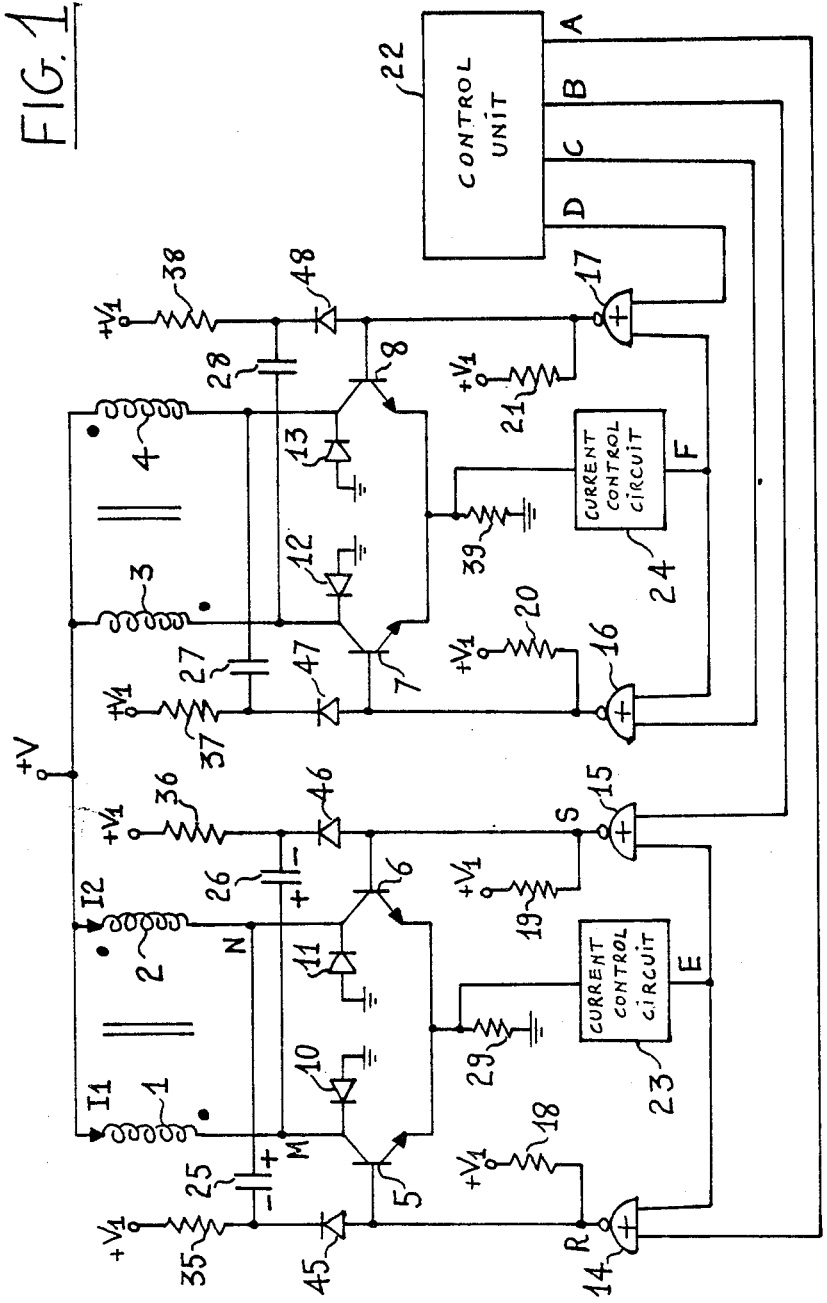
FIG. 1 shows the drive circuit of the present invention for a four phase stepping motor.

FIG. 1 shows the drive circuit for windings 1, 2, 3, 4 of a four phase stepping motor. Each pair of phase windings 1, 2 and phase windings 3, 4 are magnetically coupled. One terminal of each of the windings 1, 2, 3 and 4 is connected to a constant supply source of voltage +V. The other terminal of each of the windings 1, 2, 3 and 4 is connected to the collector of a corresponding one of the four switching transistors 5, 6, 7 and 8. The emitters of transistors 5 and 6 are connected to ground through a resistor 29 having a low resistance value, as for example, 0.5 ohms. In a similar way, the emitters of transistors 7 and 8 are connected to ground through a resistor 39 having the same resistance value as resistor 29. The cathode of each of the recycle and demagnetization diodes 10, 11, 12 and 13 is connected to the collector of a corresponding one of transistors 5, 6, 7 and 8. The anodes of diodes 10, 11, 12 and 13 are connected to ground.

When the current in phase winding 1, flowing from voltage source +V to ground is switched off due to the cutoff of transistor 5, the magnetic coupling between phase windings 1 and 2 induces in phase winding 2, an electromotive force and a recycle current flowing from ground to voltage source +V through diode 11. The function of the other diodes is similar. The bases of transistors 5, 6, 7 and 8, respectively, are connected to the outputs of the "open collector" type of the two-input NOR gates 14, 15, 16 and 17. Additionally, each of the bases connect through a corresponding one of the resistors 18, 19, 20 and 21 to a source of DC voltage +V1, having suitable value.

Each of the controlled signals A, B, C and D from a suitable control unit 22 is applied to a first input of one of the NOR gates 14, 15, 16 and 17. A description of control unit 22 is omitted here because such unit is beyond the scope of the invention and the possible embodiments of it are well known to those skilled in the art. The function of control unit 22 is to generate signals A, B, C and D in a suitable sequence so as to control the motor to work according to a desired way.

In the described embodiment, the energization sequence occurs for phase couples so as to increase the stepping motor efficiency, as well known to those skilled in the art. In order to obtain the several operative conditions of motor motion, the pairing of contemporaneously energized windings occurs according to the so-called Gray code wherein each couple differs from the previous one except for a winding. It is clear that the pairs of magnetically coupled phase windings never can be energized at the same time, otherwise the resulting torque acting on the rotor would be null.

For clarity, referring to FIG. 1, it may be assumed, for example, that in order to obtain motion in clockwise direction of the rotor of the stepping motor, the energization sequence has to be as follows. The energization of phases 1 and 3 (signals A and C at logical level 0 and signals B and D at logical level 1), the energization of phases 2 and 3 (signals B and C at logical level 0 and signals A and D at logical level 1), the energization of phases 2 and 4 (signals B and D at logical level 0 and signals A and C at logical level 1), the energization of phases 1 and 4 (signals A and D at logical level 0 and signals B and C at logical level 1), and so on.

It is clear that motion in counterclockwise direction of the rotor is obtained by reversing the energization sequence of the phases, that is, the energization of phases 1 and 4, the energization of phases 2 and 4, the energization of phases 2 and 3, the energization of phases 1 and 3, the energization of phases 1 and 4, and so on.

A further control signal E is applied to the second inputs of NOR gates 14 and 15. Signal E is generated by a current control circuit 23. In a similar way, a further control signal F is applied to the second inputs of NOR gates 16 and 17. Signal F is generated by a current control circuit 24.

Control circuit 23 receives on its input which connects to the terminal of resistor 29, a signal proportional to the energization current in phases 1 and 2. When such signal exceeds a prefixed threshold, the output signal E, which is normally at logical 0 level, rises to logical 1 level for a predetermined time interval and therefore switches off the one of two transistors 5 and 6 which was switched on.

In a similar way, control circuit 24 receives on its input which connects to a terminal of resistor 39, a signal proportional to the energization current in phases 3 and 4. When such signal exceeds a prefixed threshold which equals that of circuit 23, the output signal F which is normally at logical 0 level, rises to logical 1 level for a predetermined time interval which equals that of circuit 23. Therefore, this switches off the one of two transistors 7 and 8 which was switched on.

It is to be noted that the frequency of control signals E and F, that is, the chopping frequency of the drive circuit, is higher than the frequency of command signals A, B, C and D. A detailed description of a preferred embodiment for control circuits 23 and 24 is provided by Italian patent application number 26747 A/80 which corresponds to European patent application number 81110225.0.

A circuit which reduces transistor storage time during the switching from ON to OFF is associated with each of transistors 5, 6, 7 and 8. For example, with reference to transistor 5, such circuit comprises a capacitor 25, a diode 45 and a resistor 35. One terminal of capacitor 25 connects to the collector of transistor 6, to the cathode of diode 11 and to one terminal of winding 2 which magnetically couples to winding 1 which is associated with transistor 5. The other terminal of capacitor 25 connects to the cathode of diode 45 and to one end of resistor 35. The other end of resistor 35 is connected to voltage source +V1. The anode of diode 45 is connected to the base of switching transistor 5.

The circuits which reduce the storage times of transistors 6, 7 and 8 are connected in a similar way. More particularly, capacitor 26, diode 46 and resistor 36 form the circuit associated with transistor 6, capacitor 27, diode 47 and resistor 37 form the circuit associated with transistor 7, and capacitor 28, diode 48 and resistor 38 form the circuit associated with transistor 8.

Figure 2:
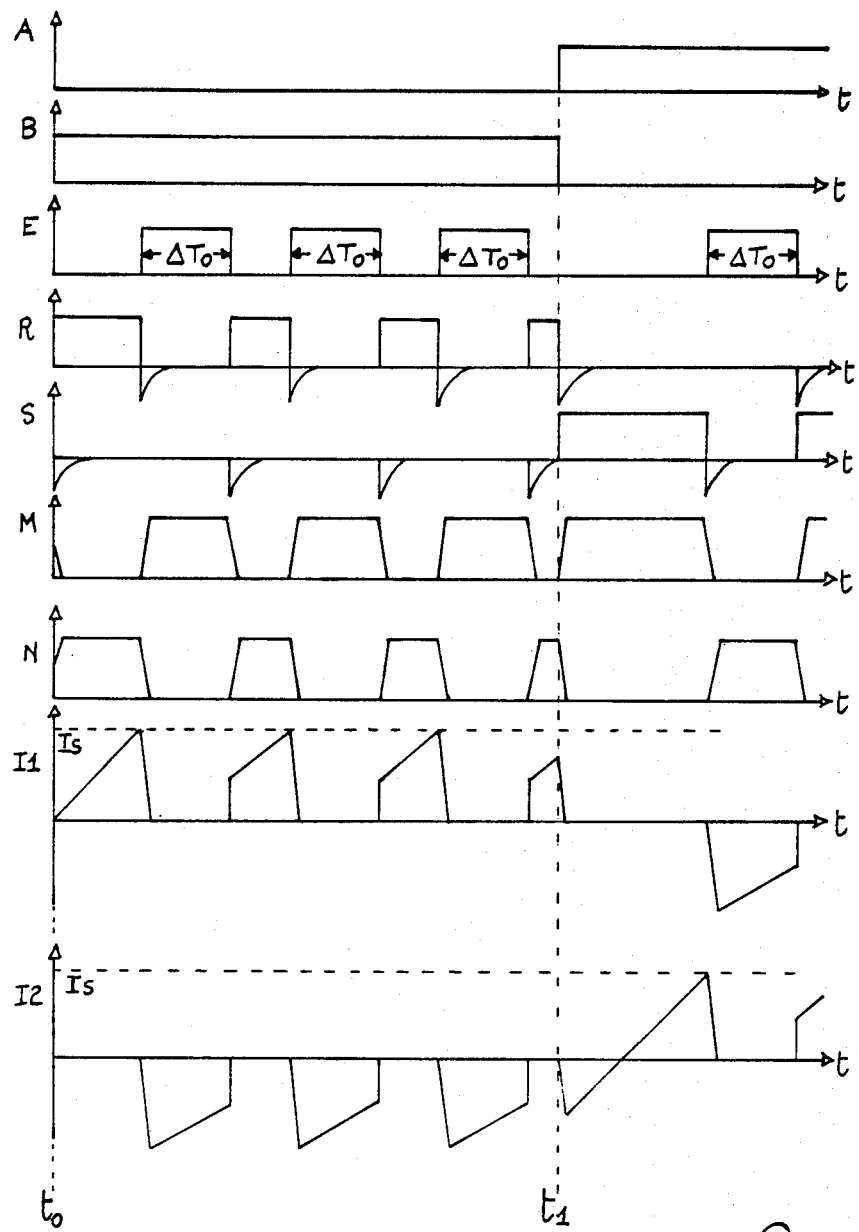
FIG. 2 shows the waveforms (current or voltage) at particular points in the drive circuit of FIG. 1.

In order to point out the action performed by the above circuits in reducing the storage times of transistors 5, 6, 7 and 8 reference must be made to the pair of windings 1 and 2 of FIG. 1 and to FIG. 2 which shows the waveforms at particular points in drive circuit of FIG. 1. The analysis of the circuits associated with windings 3 and 4 is completely similar to the analysis which will be made for the circuits associated with windings 1 and 2.

Diagrams A and B of FIG. 2 show the level of control signals A and B. Diagram E of FIG. 2 shows the level of control signal E. Diagrams R and S show the level of the signals present on the output of the NOR gates 14 and 15 respectively. Diagrams M and N show the voltage present at the collectors of transistors 5 and 6 respectively and diagrams I1 and I2 show the currents flowing through windings 1 and 2, respectively.

At rest, that is, when energization commands A and B are inactive (i.e., at logical 1 levels), the outputs of NOR gates 14 and 15 are virtually connected to ground. That is, R and S are substantially at a zero voltage level and transistors 5 and 6 are cut off. In this situation, currents I1 and I2 are null. Therefore, the current flowing through resistor 29 is null and E is at logical level 0. The points of M and N are at potential +V, capacitors 25 and 26 are subjected to a positive voltage equal to V-V1 with reference to the polarity shown in FIG. 1, and diodes 45 and 46 are biased in the reverse direction.

It is assumed that phase winding 1 is energized at a time to, that is, signal A falls to logical 0 level at time to (see diagram A of FIG. 2). Therefore, signal R rises to logical 1 level. Because NOR gate 14 is of "open collector" type, the result is the base of transistor 5 is connected to voltage source +V1 through resistor 18. It is to be noted that in such a situation, the voltage level of signal R present on the base of transistor 5 must be lower than voltage +V1 so that the diode 45 remains biased in reverse direction.

As soon as transistor 5 is saturated, point M falls to ground potential. Due to the high magnetic coupling between windings 1 and 2, the voltage change of +V on point M appears on point N causing it to move to a voltage potential of +2V. Thus, capacitor 25 is subjected to a positive voltage with reference to the polarity shown in FIG. 1 which reaches a value which equals 2V-V1 at a time constant rate proportional to the capacitance of capacitor 25 and the resistance of resistor 35.

The potential change of +V on point N is transferred through capacitor 26 and diode 46 to the base of transistor 6 therefore subjecting it to a negative voltage pulse (see diagrams S of FIGS. 2). Such pulse which has no effect on transistor 6 because it was already cut off, has a duration or width proportional to the time constant at which the voltage on capacitor 26 moves to negative value V1 with reference to the polarity shown in FIG. 1.

In particular, a negative voltage is present on the base of transistor 6 until the voltage on capacitor 26 reaches a positive value with reference to the polarity shown in FIG. 1 which equals 0.07 V. When transistor 5 is saturated, an energization current is flowing through winding 1 (i.e., see diagrams I1 of FIG. 2). When such current reaches a predetermined threshold value Is, output E of control circuit 23 rises to logical 1 level. Thus, the output of NOR gate 14 falls to logical 0 level and again cuts off transistor 5.

Point M rapidly moves to voltage +2 V and due to the high magnetic coupling, point N moves nearly to ground (more precisely to the value −0.07 V). The voltage change of +2 V on point N is transferred through capacitor 25 and diode 45 to the base of transistor 5 subjecting it to a negative voltage pulse (see diagram R of FIG. 2). For such pulse, the same considerations as those made for the negative pulse applied to the base of transistor 6 are valid. This voltage pulse allows the very rapid removal of the minority carriers from the base of transistor 6 and therefore causes current I1 to fall rapidly to zero. The sudden fall to zero of current I1 induces a current in winding 2 (see diagram I2 of FIG. 2). Such induced current flows from ground to voltage source +V through diode 11. After a time interval Δ To determined by the characteristics of control circuit 23, control signal E again falls to a logical 0 level and again saturates transistor 5.

The phenomena which follow are the same as the previous ones with the difference that, with respect to time to, capacitor 25 is now subjected to a negative voltage (with reference to the polarity shown in FIG. 1) which approximates the voltage V1 and capacitor 26 is subjected to a positive voltage (with reference to the polarity of FIG. 1) which is equal to 2 V-V1. Also, the flowing of current I1 through winding 1 occurs when a recycle current I2 is still present in winding 2, so that it is initially limited only by the leakage inductance of the windings and by the resistance of winding 1. Therefore, a fast increase of current I1 is initially obtained, such increase being contemporaneous with the fast drop of current I2 to zero. Afterwards, current I1 increases at a rate limited by the characteristic inductance and resistance of winding 1.

It is important to note that during the energization of phase winding 1, the duration of negative voltage pulse on the base of transistor 5 must be shorter than the time interval Δ To. In fact, in the opposite case, it may happen that diode 45 remains biased in forward direction when signal R rises to logical level 1. In such a condition, signal R might not saturate transistor 5. The same is true for the duration of the negative voltage pulse applied to the base of transistor 6.

It is interesting to consider what happens when a phase switching is commanded. For such purpose, it is assumed that at time t1 (FIG. 2), signal A rises to logical 1 level and at the same time signal B falls to logical 0 level. In such case, assuming E is at logical 0 level (i.e., if E were at logical 1 level, it would fall to logical level 0 at the most with a delay equal to Δ To), signal R falls to logical level 0 and cuts off transistor 5, while signal S rises to logical 1 level and saturates transistor 6. Point N rapidly moves from voltage +2 V to a zero voltage while point M rapidly moves from a zero voltage to a voltage of +2 V. Also, in such case, the voltage change on point N is transferred through capacitor 25 and diode 45 to the base of transistor 5. The resulting negative voltage pulse causes the current I1 to fall rapidly to 0.

Figure 3:
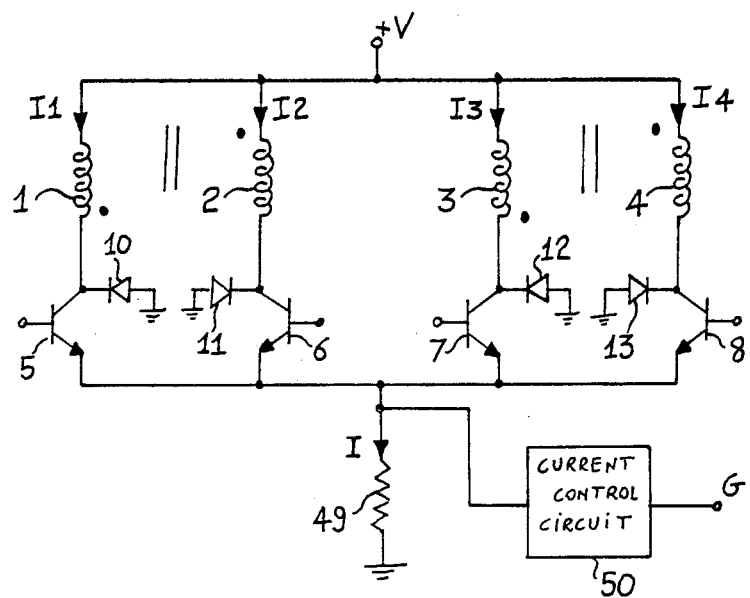
FIG. 3 shows a simplified drive circuit similar to the one of FIG. 1.

It is to be noted that current I2 is now given by two components. One component is due to the induced current flowing from ground to voltage source +V through diode 11. The other component is due to the magnetizing current flowing from voltage source +V to ground through transistor 6 and resistor 29. Immediately after the phase switching, current I2 has therefore the slope shown in FIG. 2. The analysis for the times following t1 is the same as the one already made. At this point, it can be understood why two separate current control circuits 23 and 24 have been used in the drive circuit of the invention, where the stepping motor is commanded by suitably energizing pairs of phase windings. For such purpose, FIG. 3 shows a simplified drive circuit similar to the one of FIG. 1. The drive circuit of FIG. 3 uses only a resistor 49 which connects the emitters of transistors 5, 6, 7 and 8 to ground and a single control circuit 50.

It is assumed that initially, phase windings 1 and 3 are energized. Current I flowing through resistor 49 will be the sum of currents I1 and I3 which are assumed to be equal. When I1+I3=Is (wherein Is is the current threshold which makes control circuit 50 commutate and is equal to 2Is, that is, twice the current threshold of circuits 23 and 24 of FIG. 1), output signal G of circuit 50 rises from logical 0 level to logical 1 level. This interrupts the current I which can begin flowing again after a time interval Δ To determined by circuit 50.

It is now assumed that, after energizing the couple of windings 1 and 3, the couple of windings 2 and 3 are energized. The current through resistor 49 is then I=I2+I3. However, remembering what happens to current I2 during the switching from phase 1 to phase 2 (see diagram I2 of FIG. 2), threshold value Is is reached when the current I3 is greater than current I2. This causes a current unbalance in the phase windings. Such unbalance, besides causing a rotor positioning error in the next prefixed stable positions, also causes a degradation in torque. The use of resistors 29 and 39 and the control circuits 23 and 24 in FIG. 1 avoid these disadvantages. It is clear that when the stepping motor is commanded by energizing only one phase winding at a time, it is possible and economically preferable to use the drive circuit of FIG. 3.

Figure 4:
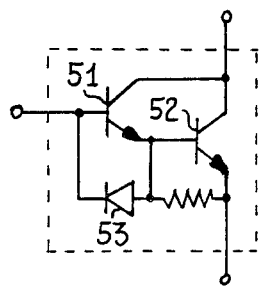
FIG. 4 shows a switch device utilizable in the drive circuit of FIG. 1.

Several modifications may be made to the described drive circuit without departing from the scope of the present invention. In particular, Darlington circuits may be used as switching transistors, as long as such Darlington circuits are provided with means able to speed up output transistor in switching from ON to OFF. For such purpose, FIG. 4 shows a Darlington circuit manufactured by Texas Instruments Inc. designated as BU180 wherein a diode 53 is placed between the bases of two transistors 51 and 52. The anode of diode 53 is connected to the base of output transistor 52. It is clear that in such a case, a negative voltage pulse applied to the control input of Darlington circuit will remove very rapidly, the minority carriers from both the base of drive transistor 51 and the base of output transistor 52.

Also, although FIGS. 1 and 3 show circuits using NPN transistors, it is clear that through obvious polarity changes, PNP transistors can be used.

What is claimed is:

1. A drive circuit for energizing a step motor having at least one pair of selectively energizable magnetically coupled phase windings, each winding having first and second ends, said drive circuit comprising:
    a DC voltage source connected to said first end of each phase winding of said pair for supplying an energizing current thereto;
    a plurality of semiconductor switching devices, each switching device having a control input and being connected in series with a different one of said phase windings of said pair;
    current chopping control means coupled to each of said control inputs for applying control signals thereto, each control signal enabling an energizing current to flow intermittently in a corresponding one of said switching devices and in said series connected phase winding associated therewith; and
    circuit means coupled to said control input of one of said switching devices connected in series with one of said pair of phase windings and to said second end of the other phase winding of said magnetically coupled pair, said circuit means being operative to apply to said control input, a voltage pulse appearing at said second end of said other phase winding when said one of said switching devices is conditioned to switch from a conductive state to a nonconductive state, said voltage pulse applied to said control input speeding up the response time of said one of said switching devices.

2. The drive circuit of claim 1 wherein said circuit means comprises:
    a capacitor having a first terminal connected to the second end of said other phase winding and a second terminal;
    a diode connected between said second terminal of said capacitor and the control input of said one switching device connected in series with said one of said phase windings; and,
    a resistor connected between said DC voltage and said second terminal of said capacitor.

3. The drive circuit of claim 2 wherein said switching device includes a pair of transistors having base, emitter and collector electrodes connected in Darlington configuration and a diode, said diode connecting said base electrodes of said transistors together.

* * * * *